United States Patent
Drouin et al.

(10) Patent No.: US 8,575,010 B2
(45) Date of Patent: Nov. 5, 2013

(54) METHOD FOR FABRICATING A SEMICONDUCTOR SUBSTRATE

(75) Inventors: Alexis Drouin, La Tranche (FR); Bernard Aspar, Saint Ismier (FR); Christophe Desrumaux, La Buissiere (FR); Olivier Ledoux, Grenoble (FR); Christophe Figuet, Crolles (FR)

(73) Assignee: Soitec, Bernin (FR)

( * ) Notice: Subject to any disclaimer, the term of this patent is extended or adjusted under 35 U.S.C. 154(b) by 183 days.

(21) Appl. No.: 12/918,935

(22) PCT Filed: Feb. 26, 2009

(86) PCT No.: PCT/EP2009/001382
§ 371 (c)(1),
(2), (4) Date: Sep. 29, 2010

(87) PCT Pub. No.: WO2009/106330
PCT Pub. Date: Sep. 3, 2009

(65) Prior Publication Data
US 2011/0024868 A1    Feb. 3, 2011

(30) Foreign Application Priority Data

Feb. 26, 2008 (EP) .................................. 08290176
Feb. 11, 2009 (EP) .................................. 09290097

(51) Int. Cl.
*H01L 31/0352* (2006.01)
*H01L 21/20* (2006.01)
*H01L 21/22* (2006.01)

(52) U.S. Cl.
USPC ..... 438/508; 438/458; 257/463; 257/E21.135

(58) Field of Classification Search
None
See application file for complete search history.

(56) References Cited

U.S. PATENT DOCUMENTS

| 5,137,837 | A  | * | 8/1992  | Chang et al. ............... 438/154 |
| 5,336,879 | A  |   | 8/1994  | Sauer .......................... 250/208.1 |
| 6,326,280 | B1 |   | 12/2001 | Tayanaka .................... 438/409 |
| 2004/0121558 | A1 |   | 6/2004  | Letertre et al. ............... 438/459 |
| 2005/0221517 | A1 |   | 10/2005 | Speyer et al. ................ 438/24 |
| 2005/0233493 | A1 |   | 10/2005 | Augusto ........................ 438/51 |
| 2006/0060922 | A1 |   | 3/2006  | Letertre et al. ............... 257/347 |
| 2006/0186560 | A1 |   | 8/2006  | Swain et al. .................. 257/E27 |
| 2007/0020895 | A1 | * | 1/2007  | Moriceau et al. ............ 438/510 |
| 2007/0235829 | A1 | * | 10/2007 | Levine et al. ................. 257/437 |

(Continued)

OTHER PUBLICATIONS

M. Bigas, E. Cabruja, J. Forest, J. Salvi, Review of CMOS image sensors, Microelectronics Journal, vol. 37, Issue 5, May 2006, pp. 433-451.*

(Continued)

*Primary Examiner* — Thomas L Dickey
*Assistant Examiner* — Joseph Schoenholtz
(74) *Attorney, Agent, or Firm* — Winston & Strawn LLP

(57) ABSTRACT

The invention relates to a method for fabricating a semiconductor substrate by providing a silicon on insulator type substrate that includes a base, an insulating layer and a first semiconductor layer, doping the first semiconductor layer to thereby obtain a modified first semiconductor layer, and providing a second semiconductor layer with a different dopant concentration than the modified first semiconductor layer over or on the modified first semiconductor layer. With this method, an improved dopant concentration profile can be achieved through the various layers which makes the substrates in particular more suitable for various optoelectronic applications.

20 Claims, 4 Drawing Sheets

(56) References Cited

U.S. PATENT DOCUMENTS

| | | | | |
|---|---|---|---|---|
| 2008/0061390 A1 | 3/2008 | Swain et al. | | 257/432 |
| 2008/0237762 A1 | 10/2008 | Swain et al. | | 257/432 |
| 2008/0248631 A1 | 10/2008 | Letertre et al. | | 438/459 |
| 2009/0206377 A1 | 8/2009 | Swain et al. | | 257/292 |
| 2009/0256227 A1 | 10/2009 | Bhaskaran et al. | | 257/432 |
| 2009/0294804 A1 | 12/2009 | Goodman | | 257/213 |
| 2009/0294883 A1 | 12/2009 | Swain et al. | | 257/431 |
| 2009/0298260 A1 | 12/2009 | Zhu et al. | | 438/458 |

OTHER PUBLICATIONS

Van Noort, Wibo D., L. K. Nanver, and J. W. Slotboom. "Control of Arsenic Doping during Low Temperature CVD Epitaxy of Silicon (100)." Journal of the Electrochemical Society 147.11 (2000): 4301.*

Celler, G. and Wolf, M., Smart Cut™ A guide to the technology, the process, the products, Soitec 2003 downloaded from URL <http://www.soitec.com/pdf/SmartCut_WP.pdf> on Sep. 14, 2012.*

International Search Report, PCT/EP2009/001382, mailed Jun. 19, 2009.

* cited by examiner

METHOD FOR FABRICATING A SEMICONDUCTOR SUBSTRATE

This application is a 371 filing of International Patent Application PCT/EP2009/001382 filed Feb. 26, 2009.

BACKGROUND

The invention relates to a method for fabricating a semiconductor substrate starting from a silicon on insulator (SOI) type substrate.

In the optoelectronics, special substrates are needed which are for example used for image sensors, which find their application in video or photographic cameras. In these substrates, which are based on SOI type substrates, a buried oxide (BOX) is provided on a base through which photons can be collected from the backside of the wafer. Alternatively, the image sensors formed in the device layer of the SOI substrate could be transferred to a final substrate to expose the backside of the sensors. A thin highly doped p++ (or n++) first semiconductor layer is directly provided on the buried oxide and a second semiconductor layer with a lower dopant concentration (p–/n– layer) is provided on the first semiconductor layer.

In the prior art, this kind of special substrate was prepared using a highly doped substrate as the donor wafer in the conventional Smartcut™ technology. This method typically comprises the steps of providing a donor substrate, e.g. a silicon wafer, providing an insulating layer on the donor substrate and creating a predetermined splitting area inside the donor substrate, which is achieved by implanting atomic species or ions, like helium or hydrogen ions, into the donor substrate. In the next step the donor substrate is bonded to a base substrate, e.g. a further silicon wafer, such the insulating layer is sandwiched between handle and donor substrate. Subsequently, the remainder of the donor substrate is detached from the bonded donor-base substrate at the predetermined splitting area following a thermal and/or mechanical treatment upon the predetermined splitting area. As a result a semiconductor on insulator (SOI) substrate is obtained.

However, the use of a highly doped substrate can lead to the following problem: It can be observed that cross-contamination from one donor wafer, e.g. with a high dopant concentration, to another wafer, e.g. with a lower dopant concentration like in the standard SOI substrates, occurs within the production line. This leads to unsatisfying dopant profiles in both the p++ type SOI wafers and the standard p– SOI wafers. In addition, during subsequent annealing steps during the SmartCut™ process, a diffusion of dopants out of the highly doped layer occurs which further deteriorates the substrate.

According to an alternative method a standard SOI substrate with a thin p– (or n–) semiconductor layer was used as starting material over which a further semiconductor layer with a p++ dopant concentration was provided. Finally, an additional semiconductor layer with p– concentration was provided to obtain the desired layer structure. With this method it is, however, not possible to reach a sufficient high dopant concentration in the p++ layer and furthermore the dopant concentration is not sufficiently flat, meaning that that the dopant concentration through the layer is not monotonic, but first increasing and then decreasing within the p++ layer.

SUMMARY OF THE INVENTION

Starting therefrom, it is the object of the present invention to provide a semiconductor substrate manufacturing process with which improved semiconductor substrates of the above described type can be achieved, thus which represent an improved dopant profile, in particular, in the highly doped p++ layer.

This object is achieved by a method that comprises the steps of: a) providing a silicon on insulator (SOI) type substrate comprising a base, an insulating layer and a first semiconductor layer, b) doping the first semiconductor layer to thereby obtain a modified first semiconductor layer, and c) providing a second semiconductor layer with a different dopant concentration than the modified first semiconductor layer over, in particular on, the modified first semiconductor layer.

With this method an improved semiconductor substrate can be achieved as, the dopant concentration of the modified first semiconductor layer is established only once the SOI type substrate itself has been prepared. Thus, during the fabrication process of the SOI substrate itself, the same kind of donor substrates like in the standard procedure can be provided. Therefore, no cross-contamination from donor wafers with different dopant concentrations is observed and the dopant profile can not be deteriorated by annealing steps in the SOI fabrication procedure.

Preferably, the dopant concentration in the modified first semiconductor layer is higher than in the second semiconductor layer. Like already mentioned this kind of substrate plays an important role, in particular, in optoelectronic applications and with the improved dopant concentration profile which can be achieved with the inventive method, improved final products are obtained.

Advantageously, the second semiconductor layer can be epitaxially grown over, in particular on, the modified first semiconductor layer. By doing so, the quality of the substrate can be further improved.

Preferably, the modified first semiconductor layer can be a highly doped n++ or p++ semiconductor layer, thus with a dopant concentration in the range of $10^{17}$ atoms/cm$^3$ up to $10^{20}$ atoms/cm$^3$. Thus, with this method, the high dopant concentrations necessary for high quality image sensors can be achieved with an improved dopant concentration profile through the different layers.

Preferably, in step c), the second semiconductor layer is provided as an n– or p– semiconductor layer. Dopant concentrations in the range of $1\times10^{14}$ to $1\times10^{16}$ atoms/cm$^3$ can be achieved with a clear interface between the highly doped first semiconductor layer and the second semiconductor layer. Thus again, improved substrates can be achieved.

According to a preferred variant, the doping, in particular by diffusion doping, and the growth of the second semiconductor layer can occur at the same time. Thus the epitaxial deposition can be achieved with the desired dopant level in one process run which has a positive impact on the dopant profile compared to prior art process in which doping occurs by implantation after the growth of a layer.

According to an advantageous embodiment, steps b) and c), thus the doping step of the first semiconductor layer and the second layer providing step, can be carried out in the same fabrication device, in particular an epi-reactor. By doing so, the special provision of a diffusion chamber, which is usually used to dope semiconductor layers, becomes obsolete. Using an epi-reactor for both steps, thus facilitates the production line, due to the fact that one tool, like the diffusion chamber, is no longer part of the production line. In addition, in the epi-reactor the wafers are treated one by one, whereas in the diffusion chambers about 100 wafers are treated at a time.

According to a preferable embodiment, the base can be out of a transparent material. For instance, quartz-type substrates can be employed to provide the transparency of the base substrate with respect to the visible wavelength range, which is necessary for optoelectronic applications.

Advantageously, the (modified) first semiconductor layer can have a thickness in a range of 50 nm to 800 nm, preferably 55 nm to 200 nm and/or the second semiconductor layer can have a thickness in a range of up to 8 µm, and/or the insulating layer can have a thickness of 50 nm to 1500 nm, in particular 100 nm to 400 nm. With the advantageous method, it is possible to provide highly doped and lowly doped semiconductor layers within a wide range of thicknesses. In particular, it is possible to provide a thin highly doped layer in the presence of a thicker lowly doped layer while keeping the desired dopant profile.

Advantageously, the dopants used can be Sb or As. The use of these dopants limits the impact of diffusion. Even more preferably, Sb can be used, in order to limit also the impact of a phenomenon called "autodoping". After doping the first semiconductor layer to obtain the modified first semiconductor layer and during the growth of the second semiconductor layer with its lower intentional doping concentration, an unintentional doping of the second semiconductor layer can arise from the first semiconductor layer, but also from the backside of the SOI substrate, thus from the base 3, or from a dopant release from the walls of the deposition chamber walls or other parts of the chamber. Autodoping actually leads to a certain degradation of the desired doping level in the semiconductor layers, but also of the transition region of the profile thus between the highly doped and lowly doped layer. As a consequence the electrical device characteristics become negatively affected.

Preferably, the first and/or second semiconductor layer are obtained by a CVD process using chlorine (Cl) containing precursor gases. It has been observed that the more chlorine Cl is present in the precursor gases, the less the negative impact of autodoping.

According to a preferred embodiment, the process parameters, in particular growth pressure and/or growth rate and/or deposition temperature, can be chosen such as to limit the autodoping effect. Preferably, the growth pressure can be lower than 400 torr or further preferred even lower than 100 torr. According to a preferred variant, the growth rate can be lower than 2 micron/min or even further preferred lower than 1 micron/min. According to another preferred variant, the deposition temperature can be higher than 1000° C. or even higher than 1075° C.

Preferably, step a) can comprise the steps of: a1) providing a donor substrate, a2) providing an insulating layer on the donor substrate, a3) creating a predetermined splitting area inside the donor substrate, a4) bonding the donor substrate to the handle substrate, and a5) detaching a remainder of the donor substrate from the bonded donor handle substrate at the predetermined splitting area to thereby form the SOI substrate. With this so called Smartcut™ technology, high quality SOI wafers can be achieved and which can serve in the advantages method, even in cases when only a part of the SOI substrate leaving the production line will be used to create the substrates according to this invention.

The invention also relates to optoelectronic sensors, in particular an image sensor, comprising the semiconductor substrate fabricated as described and shown herein. As already mentioned above, the inventive methods allow creation of a superior substrate which in turn will also improve the qualities of the final product, e.g. the image sensor which uses the substrate.

BRIEF DESCRIPTION OF THE DRAWINGS

Advantageous embodiments of the invention will be described in the following in relation to the Figures.

DETAILED DESCRIPTION OF THE INVENTION

Figure 1A:
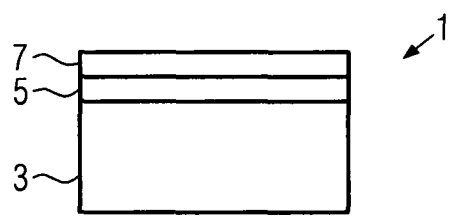
FIGS. 1a-1c illustrate the steps of one embodiment according to the inventive method for fabricating a semiconductor substrate.
Figure 3A:
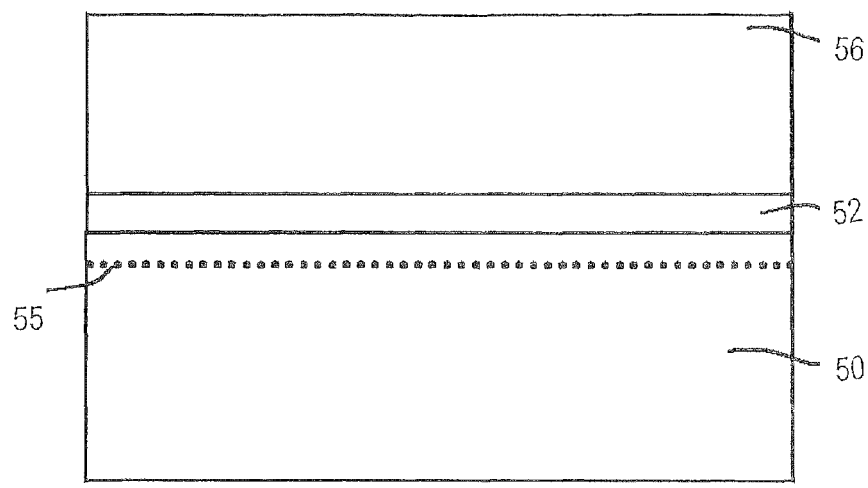
FIG. 3a and FIG. 3b illustrate a SMART CUT process during which a predetermined splitting area is created inside the donor substrate.
Figure 3B:
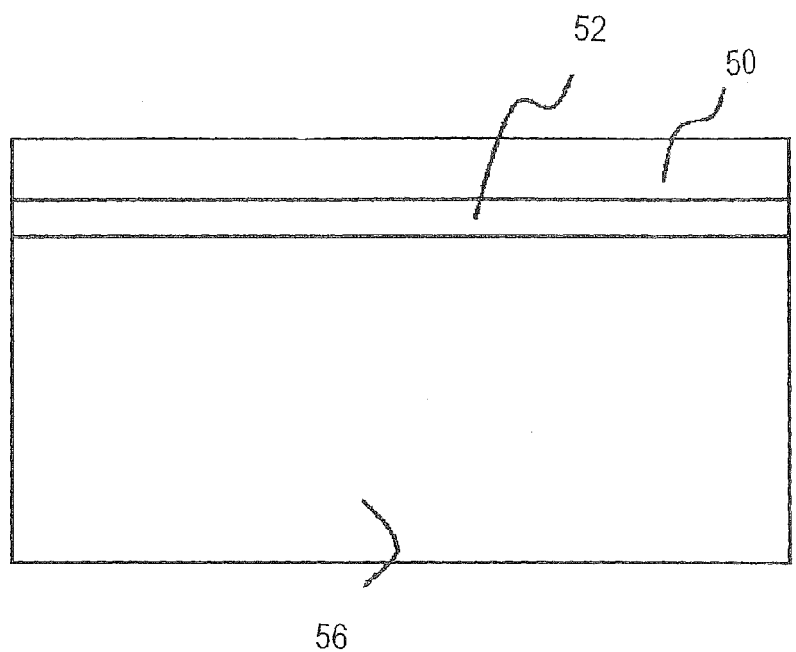

According to step a) of the inventive method, a SOI type substrate 1 is provided as illustrated in FIG. 1a. One way to fabricate such a substrate 1 is the so called SmartCut™ technology as shown in FIGS. 3a and 3b. This method typically comprises the steps of providing a donor substrate 50, e.g. of a silicon wafer or a transparent substrate like quartz, providing an insulating layer on the donor and/or on the base substrate (the insulating layer 52 is shown on the base substrate) and creating a predetermined splitting area 55 inside the donor substrate, which is achieved by implanting atomic species or ions, like helium or hydrogen ions, into the donor substrate. In the next step the donor substrate 50 is bonded to the base substrate 56, e.g., a further silicon wafer, such the insulating layer 52 is sandwiched between handle base and donor substrates as shown in FIG. 3a. Subsequently, the remainder of the donor substrate is detached from the bonded donor-base substrate at the predetermined splitting area following a thermal and/or mechanical treatment upon the predetermined splitting area. As a result a semiconductor on insulator (SOI) substrate of FIG. 3b is obtained. With this method, the insulating layer finds itself between the semiconductor layer transferred from the donor substrate and the base substrate. This layer then forms the abovementioned buried oxide layer (BOX).

Accordingly the SOI type substrate 1 provided in step a) of the inventive method comprises a base 3, typically silicon. However, depending on the application also other materials are suitable, like for example transparent materials, like quartz, which find their application in optoelectronic applications.

On the base 3, or on the donor, an insulating layer 5 is provided, which is typically a silicon dioxide. However, again other insulating materials like silicon nitride or a stack of layers might also form the insulating layer 5.

Over the insulating layer 5, a first semiconductor layer 7 is provided, which is typically a silicon layer. However, also for this layer, other semiconductor materials like germanium might also be used.

The thickness of the insulating layer is from about 50 nm to 1500 nm, preferably in a range of 100 nm to 400 nm. The semiconductor layer 7 typically has a thickness of 50 nm to 800 nm, preferably 55 nm to 200 nm.

Figure 1B:
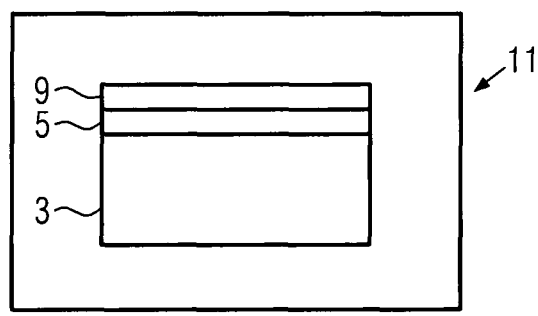

According to step b) of claim 1, illustrated in FIG. 1b, the next step of the inventive method consists in doping the first semiconductor layer 7 to thereby obtain a modified first semiconductor layer 9. This can for example be carried out in a diffusion chamber 11, thus leading to an in-situ doping. Typically, doping is carried out with boron or phosphorous atoms to obtain n-type or p-type kinds of doping in a flow of hydrogen with temperatures of about 900-1200° C., preferably 1100-1160° C. and for a time duration of 30 seconds-4 minutes. This treatment will turn a p− semiconductor layer into a p++ semiconductor layer with a dopant concentration of $10^{17}$ or more Atoms/cm$^3$ and in case of n− semiconductor layer as first semiconductor layer to an n++ layer with a dopant concentration of $10^{17}$ or more Atoms/cm$^3$.

The next step according to the invention (step c of claim 1) consists in providing a second semiconductor layer 13 with a different dopant concentration than the one of the modified first semiconductor layer 9. This step is typically carried out in a epi-reactor 15 and will result in second semiconductor layer 13 achieved by epitaxial growth on the modified first semiconductor layer 9. For a silicon layer, the used precursor gases can be TCS, DCS, or silane and for doping the layer, again boron or phosphorous n-type or p-type dopants are used. The growth typically takes place at a temperature of 1000-1200° C. and a layer with a thickness of up to 8 μm can be achieved. The dopant concentration is of the order of $1\times10^{14}$ to $1\times10^{16}$ atoms/cm$^3$. Preferably, the doping is carried out during the growth of the second semiconductor layer by in-situ doping thus based on diffusion doping.

Figure 2A:
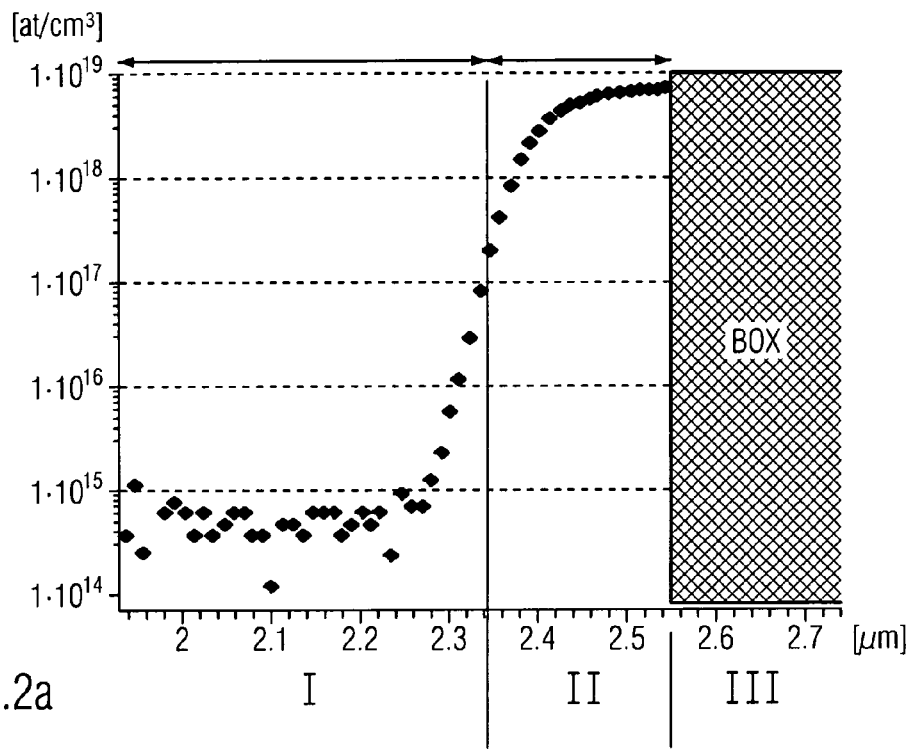
FIGS. 2a-2b illustrate a typical dopant concentration profile in a semiconductor substrate fabricated according to the invention in comparison to one fabricated according to the prior art process.
Figure 2B:
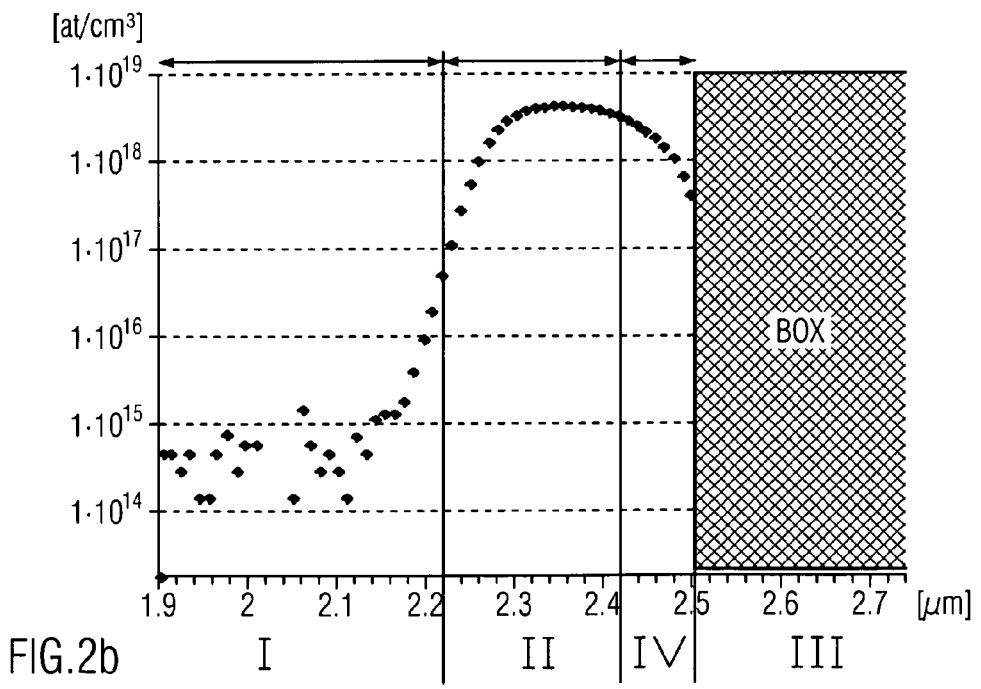

FIGS. 2a and 2b illustrate dopant concentration profiles of a semiconductor substrate fabricated according to the first embodiment (FIG. 2a) and a substrate fabricated according to the prior art method described further above (FIG. 2b).

FIG. 2a illustrates the dopant concentration on the y axis versus a cross section of the substrate on the x axis. Region I of the dopant concentration corresponds to the second semiconductor layer 13 with a fairly constant dopant concentration of about $4\times10^{14}$ atoms/cm$^3$. The second Region II corresponds to the modified first semiconductor layer 9 with a dopant concentration going up to $8\times10^{18}$ atoms/cm$^3$. The highly doped layer 13 has actually a dopant profile which continuously, monotonically, increases and becomes rather flat towards the subsequent buried oxide layer (BOX). This layer has a thickness of 200 nm. Then, the buried oxide insulating layer 5 is represented in Region III. In the shown example, which was fabricated according to the invention, the base substrate 3 was a silicon wafer.

In contrast thereto, FIG. 2b illustrates a dopant profile that is achieved with the prior art method in which a standard SOI substrate with a thin p− (or n−) semiconductor layer is used as starting material over which a further semiconductor layer with a p++ (n++) dopant concentration is provided. Like in FIG. 1, Region I illustrates the lowly doped semiconductor layer with its dopant concentration of the order of $7\times10^{14}$ atoms/cm$^3$. Subsequently, in Region II, the highly doped layer has a dopant concentration going up to $7\times10^{18}$ atoms/cm$^3$. Then follows the thin lowly doped semiconductor layer already present on the starting SOI substrate in Region IV. This layer is thus positioned between the Regions II and the buried oxide layer region III. Due to diffusion, the lowly doped thin semiconductor layer in Region IV has seen its dopant concentration increasing, so that, in the end, the dopant profile of the highly doped layer in Region II first grows (seen from Region I) and then decreases again towards the buried oxide layer. Comparing the two profiles, it appears the for the desired optoelectronic applications, the profile illustrated in FIG. 2a is preferable.

Figure 1C:
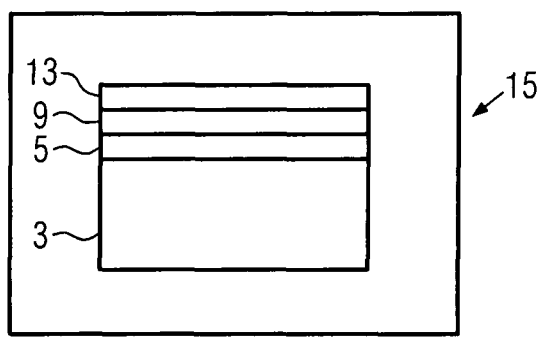

According to a second inventive embodiment, the steps illustrated in FIGS. 1b and 1c are carried out in the same device, namely in the epi-reactor 15, so that, in FIG. 1b instead of doping of the first semiconductor layer 7 in an additional diffusion chamber 11, doping is carried out in the epi-reactor 15. This has the advantage that only one tool needs to be provided instead of two. Furthermore, the overall fabrication process is easier to carry out as in the epi-reactor, one wafer after the other is treated, whereas in the diffusion chamber 11, approximately 100 wafers are treated at the same time. By, in particular, providing the desired dopant level of the second semiconductor layer 13 at the same time as the layer is grown, the desired abrupt change over from high to low doped regions is achieved. This abrupt change like illustrated in FIG. 1 cannot be achieved with doping using implantation.

With the described inventive method, the following advantages can be achieved with respect to the known methods in the prior art. With respect to the process for fabricating a semiconductor substrate which starts from a SOI substrate with a p++ or n++ first semiconductor layer, the present invention brings the advantage that dopant cross-contamination risk between lowly doped and highly doped SOI wafers within one manufacturing line can be eliminated and furthermore, due to the doping of the first semiconductor layers 7 in an own doping step, a tailor-made dopant profile can be achieved which is independent of the starting SOI material.

With respect to the method in which the starting material is a standard SOI substrate with a p− semiconductor layer over which a p++/n++ first semiconductor layer is epitaxially grown and over which in turn the p−/n− second layer will be grown is that, with the inventive method, a higher doping concentration can be achieved inside the p++/n++ modified first semiconductor layer 9 and, in addition, the concentration profile in the p++/n++ layer 9 can be kept essentially flat or at least evolves monotonically over its thickness (see FIG. 2a), whereas it decreases and then increases within the p++/n++ layer with prior art technique (see FIG. 2b).

Thus, with the inventive method, superior semiconductor substrates can be achieved, which find their application in optoelectronics, in particular in image sensors. With the inventive method it is furthermore possible to have a large process window in terms of doping species, which in addition do not depend on the starting SOI substrate, and to have tailor-made doping levels, which do not depend on the bulk material available.

A third inventive embodiment, further improves the dopant concentration profile by reducing the impact of a phenomenon called "autodoping".

After doping the first semiconductor layer 7 to obtain the modified first semiconductor layer 9 and during the growth of the second semiconductor layer 13 with its lower intentional doping concentration, an unintentional doping of the second semiconductor layer 13 can arise from the first semiconductor layer. Autodoping may also arise from the backside of the SOI substrate 1, thus from the base 3, but also from a dopant release from the walls of the deposition chamber walls or other parts of the chamber. Autodoping actually leads to a certain degradation of the desired doping level in the layers 9 and 13, but also of the transition region of the profile thus between the highly doped 9 and lowly doped layer 11 and which has an impact on the electrical device characteristics.

The autodoping proceeds through a two steps mechanism: out-diffusion of the dopants from the material into the chamber and then re-incorporation of the dopants during the subsequent growth of the second semiconductor layer 13.

According to the third embodiment invention out-diffusion can be reduced by optimizing the deposition parameters of the first and/or second semiconductor layer, e.g. the bake pressure, the bake temperature, the bake time, in situ etch, the deposition pressure, the deposition temperature or the surface gas velocity.

For instance with a growth pressure of lower than 400 torr or even lower than 100 torr, a growth rate lower than 2 micron/min or even further preferred lower than 1 micron/min and a deposition temperature higher than 1000° C. or even higher than 1075° C. the autodoping effect can be reduced.

Instead or in addition, the method according to the third embodiment uses optimized deposition precursors and/or dopants. Instead of using boron or phosphorous atoms as dopants, the method according to the third embodiment uses arsenic As or even further preferred antimony Sb, for which a reduced autodoping phenomenon has been observed which is attributed to a reduced out-diffusion. On the precursor side, it is preferred to use silicon precursor molecules containing chlorine Cl instead of using silane. The more Cl atoms in the molecule the lower the impact of autodoping. Thus SiH4 is worse than SiH3Cl which in turn is worse than SiH2Cl2 which is worse than SiHCl3 which again is worse than SiCl4.

Finally, when the desired doping level and doping profile in the first and second semiconductor layer 9 and 13 are achieved, a subsequent degradation can be prevented or at least kept lower by optimizing the subsequent thermal treatments. On the one side this can be achieved by limiting the total thermal budget in time or temperature or to use the above mentioned dopants Sb or As rather than B or P with their lower diffusion coefficient.

The invention claimed is:

1. A method for fabricating a semiconductor substrate having an improved dopant profile which comprises:
    providing a silicon on insulator (SOI) substrate comprising a base, an insulating layer and a first semiconductor layer;
    doping the first semiconductor layer to thereby obtain a modified first semiconductor layer; and
    providing a second semiconductor layer with a different dopant concentration than the modified first semiconductor layer upon the modified first semiconductor layer;
    wherein the doping of the first semiconductor layer and the providing of the second semiconductor layer are carried out in the same fabrication device without removing the subtrate to thus provide an improved dopant profile in the fabricated semiconductor substrate.

2. The method of claim 1, wherein the second semiconductor layer is epitaxially grown upon the modified first semiconductor layer.

3. The method of claim 1, wherein doping of the second semiconductor layer is achieved by diffusion doping and growth of the second semiconductor layer occurs at the same time as the diffusion doping.

4. The method of claim 1, wherein the fabrication device is an epi-reactor.

5. The method of claim 4, wherein doping of the first semiconductor layer is achieved by a doping with n-type or p-type doping atoms to provide the first semiconductor layer with a dopant concentration of at least $10^{17}$ atoms/cm$^3$.

6. The method of claim 5, wherein doping of the first semiconductor layer is carried out with boron or phosphorus atoms in a flow of hydrogen with temperatures of about 900 to 1200° C. and for a time of 30 seconds to 4 minutes.

7. The method of claim 5, wherein the second semiconductor layer is epitaxially grown from a precursor gas that contains n-type or p-type dopant atoms to provide the second semiconductor layer with a dopant concentration of about $10^{14}$ to $10^{16}$ atoms/cm$^3$.

8. The method of claim 7, wherein the n-type or p-type dopant atoms of the second semiconductor layer are boron or phosphorus with the epitaxially growth taking place at a temperature of 1000 to 1200° C.

9. The method of claim 1, wherein the first semiconductor layer has a thickness of 50 nm to 800 nm, the second semiconductor layer has a thickness of up to 8 μm, and the insulating layer has a thickness of 50 nm to 1500 nm.

10. The method of claim 1, wherein the first semiconductor layer has a thickness of 55 nm to 200 nm, the second semiconductor layer has a thickness of up to 8 μm, and the insulating layer has a thickness of 100 nm to 400 nm.

11. The method of claim 1, wherein the dopant concentration in the modified first semiconductor layer is higher than in the second semiconductor layer.

12. The method of claim 1, wherein after doping, the modified first semiconductor layer is a highly doped n++ or p++ semiconductor layer.

13. The method of claim 1, wherein the second semiconductor layer is provided as a n− or p− semiconductor layer.

14. The method of claim 1, wherein the doping is conducted with Sb or As dopants.

15. The method of claim 14, wherein the first or second semiconductor layers, or both, are obtained by a CVD process using chlorine containing precursor gases.

16. The method of claim 15, wherein CVD process includes a growth pressure that is lower than 400 torr, a growth rate that is lower than 2 micron/min, and a deposition temperature that is higher than 1000° C.

17. The method of claim 15, wherein CVD process includes a growth pressure that is lower than 100 torr, a growth rate that is lower than 1 micron/min, and a deposition temperature that is higher than 1075° C.

18. The method of claim 1, wherein the providing of the SOI substrate comprises:
    providing a donor substrate;
    providing an insulating layer on the donor substrate or a base substrate;
    creating a predetermined splitting area inside the donor substrate;
    bonding the donor substrate to the base substrate; and
    detaching a remainder of the donor substrate from a bonded donor-base substrate at the predetermined splitting area to thereby transfer a layer of the donor substrate including the insulating layer onto the base substrate to form the SOI substrate.

19. The method of claim 18, wherein the insulating layer is provided on one of the donor substrate and the base substrate.

20. A method for fabricating a semiconductor substrate having an improved dopant profile which comprises:
    providing a silicon on insulator (SOI) substrate comprising a base, an insulating layer and a first semiconductor layer;
    doping the first semiconductor layer with n-type or p-type doping atoms in a flow of hydrogen with temperatures of about 900 to 1200°C. and for a time of 30 seconds to 4 minutes to thereby obtain a modified first semiconductor layer having a dopant concentration of at least $10^7$ atoms/cm$^3$; and
    epitaxially growing a second semiconductor layer with a different dopant concentration than the modified first semiconductor layer upon the modified first semiconductor layer, wherein the second semiconductor layer is epitaxially grown at a temperature of 1000 to 1200° C. from a precursor gas that contains n-type or p-type dopant atoms to provide the second semiconductor layer with a dopant concentration of about $10^{14}$ to $10^{16}$ atoms/cm$^3$;
    wherein the doping of the first semiconductor layer and the providing of the second semiconductor layer are both carried out in n epi-reactor without removing the substrate to thus provide an improved dopant profile in the fabricated semiconductor substrate; and
    wherein the first semiconductor layer has a thickness of 50 nm to 800 nm, the second semiconductor layer has a thickness of up to 8 μm, and the insulating layer has a thickness of 50 nm to 1500 nm.

* * * * *

UNITED STATES PATENT AND TRADEMARK OFFICE
CERTIFICATE OF CORRECTION

PATENT NO. : 8,575,010 B2  
APPLICATION NO. : 12/918935  
DATED : November 5, 2013  
INVENTOR(S) : Drouin et al.

Page 1 of 1

It is certified that error appears in the above-identified patent and that said Letters Patent is hereby corrected as shown below:

In the Specification

Column 4:
Line 27, after "between", delete "handle".

In the Claims

Column 7:
Line 27 (claim 1, line 15), change "subtrate" to -- substrate --.

Signed and Sealed this
Seventeenth Day of December, 2013

Margaret A. Focarino
*Commissioner for Patents of the United States Patent and Trademark Office*

UNITED STATES PATENT AND TRADEMARK OFFICE
CERTIFICATE OF CORRECTION

PATENT NO. : 8,575,010 B2  Page 1 of 1
APPLICATION NO. : 12/918935
DATED : November 5, 2013
INVENTOR(S) : Drouin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 217 days.

Signed and Sealed this
Twenty-second Day of September, 2015

Michelle K. Lee
*Director of the United States Patent and Trademark Office*